US008537562B1

(12) United States Patent
Bowie et al.

(10) Patent No.: US 8,537,562 B1
(45) Date of Patent: Sep. 17, 2013

(54) CHAMBER FOR ISOLATION FROM RADIOFREQUENCY INTERFERENCE

(71) Applicant: Paradigm Circuit Solutions Inc., Cupertino, CA (US)

(72) Inventors: Neil D. Bowie, Sunnyvale, CA (US); Chang An Nan, Taoyuan (TW)

(73) Assignee: Paradigm Circuit Solutions Inc., Cupertino, CA (US)

( * ) Notice: Subject to any disclaimer, the term of this patent is extended or adjusted under 35 U.S.C. 154(b) by 0 days.

(21) Appl. No.: 13/626,801

(22) Filed: Sep. 25, 2012

Related U.S. Application Data (63) Continuation of application No. 13/478,443, filed on May 23, 2012, now Pat. No. 8,281,917.

(51) Int. Cl.
*H05K 5/00* (2006.01)

(52) U.S. Cl.
USPC ........ 361/759; 312/223.1; 220/315; 220/833; 220/834

(58) Field of Classification Search
USPC .. 198/346.1; 414/414; 206/719; 312/223.1; 361/730, 732, 759, 800; 174/350, 50.63; 220/62.16, 315, 802, 803, 833, 834
See application file for complete search history.

(56) References Cited

U.S. PATENT DOCUMENTS

| | | | | |
|---|---|---|---|---|
| 3,281,958 A * | 11/1966 | Lambert et al. | | 34/222 |
| 4,800,174 A * | 1/1989 | Ishihara et al. | | 438/96 |
| 4,820,378 A * | 4/1989 | Loewenstein | | 438/711 |
| 5,256,576 A * | 10/1993 | Guha et al. | | 438/96 |
| 5,383,098 A * | 1/1995 | Ma et al. | | 361/818 |
| 5,867,270 A * | 2/1999 | Beckwith et al. | | 356/476 |
| 5,946,199 A * | 8/1999 | Matsuzaki | | 361/818 |
| 6,061,966 A * | 5/2000 | Nelson et al. | | 49/394 |
| 6,128,187 A * | 10/2000 | Mimlitch, III et al. | | 361/690 |
| 6,138,347 A * | 10/2000 | Persson et al. | | 29/836 |
| 6,297,967 B1 * | 10/2001 | Davidson et al. | | 361/800 |
| 6,365,832 B1 * | 4/2002 | Staron et al. | | 174/541 |
| 6,590,784 B2 * | 7/2003 | Wortman et al. | | 361/816 |
| 6,731,518 B2 * | 5/2004 | Suzuki et al. | | 361/818 |
| 6,751,570 B2 * | 6/2004 | Boswell et al. | | 702/121 |
| 6,787,696 B2 * | 9/2004 | Liljevik et al. | | 174/371 |
| 6,813,646 B2 * | 11/2004 | Brandes et al. | | 710/3 |
| 7,013,834 B2 * | 3/2006 | Tyler et al. | | 118/723 E |
| 7,359,206 B2 * | 4/2008 | Toy et al. | | 361/725 |
| 8,281,917 B1 * | 10/2012 | Bowie et al. | | 198/346.1 |

* cited by examiner

*Primary Examiner* — Douglas Hess
(74) *Attorney, Agent, or Firm* — Gard & Kaslow LLP (57) ABSTRACT

Manufacture of electronic devices is usually accomplished through automated assembly lines using automated conveyors. These automated conveyors, typically comprising metallic components, cannot convey electronic devices into an RF chamber for testing (e.g., RF) during manufacture without compromising the efficacy of the shielding provided by the RF chamber. Thus, although electronic devices are assembled on automated assembly lines, a device is typically removed from the automated assembly line for testing, transported manually into an RF chamber, powered on, and then tested. After testing, the electronic device is powered down, manually removed from the RF chamber, and returned to the assembly line. Described herein are embodiments of a system and method to automatically transport electronic devices under power through an RF isolated chamber for testing (e.g., RF) as part of an automated assembly line process resulting in a dramatic increase in the number of electronic devices that can be tested.

20 Claims, 11 Drawing Sheets

CHAMBER FOR ISOLATION FROM RADIOFREQUENCY INTERFERENCE

CROSS-REFERENCE TO RELATED APPLICATIONS

This application is a continuation of U.S. patent application Ser. No. 13/478,443, entitled "System and Method To Automate Transport Of Electronic Devices On An Assembly Line For Testing," filed May 23, 2012, the disclosure of which is hereby incorporated by reference herein.

BACKGROUND OF THE INVENTION

1. Field of the Invention

The present invention relates generally to assembly line processing of electronic devices, and more particularly to automated transport of electronic devices under power for testing in an isolated RF chamber during assembly line processing.

2. Description of the Prior Art

Electronic devices (e.g., computers, electronic tablets, cellular phones, smartphones, and appliances) are mass-produced through assembly line processing. This assembly line processing is largely automated, with one important exception: testing of the electronic devices.

Testing of these electronic devices is a challenging issue because the testing needs to be performed in an environment shielded from electromagnetic interference. Interference from electromagnetic radiation (also known as radiofrequency (RF) inference) can interrupt, obstruct, or otherwise degrade or limit the effective performance of electronic circuits, resulting in inaccurate test results. One way to control this problem is to test electronic devices in an RF chamber such as a Faraday cage or an RF shielded chamber.

An RF chamber is an enclosure formed from a conducting material (e.g., copper) or a mesh of the conducting material. A static electrical field outside the RF chamber causes electrical charges within the cage walls of conducting material to redistribute so as to cancel the electrical field's effects within the interior of the chamber. Thus, by intercepting the external electrical fields, the RF chamber shields the interior of the chamber from exterior electromagnetic radiation.

RF chambers are typically designed as either benchtop lab units or as room-sized chambers. Regardless of the type, the interior of the RF chamber must be completely enclosed—that is, sealed off from the external environment—to reap the benefit of protection from electromagnetic interference. RF chambers used in laboratory settings are typically accessed through one hinged door. A door opening (i.e., frame) in the RF chamber, however, breaks the RF shielding around the chamber, thereby allowing electromagnetic fields to penetrate the chamber through the opening. In an attempt to block electromagnetic fields from entering the RF chamber through the opening, a gasket interface is typically inserted between the door and the door opening of the chamber. The gaskets used in non-military settings typically shield up to about 60-80 dB at e.g., up to 4 GHz reliably. One problem with these RF chambers is that the gasket interface, subject to repeated wear and tear as the door is opened and closed, is a weak point in the RF shielding which can require frequent maintenance and/or replacement. Military modifications of the typical laboratory RF chamber have achieved a higher attenuation (shielding in excess of 100 dB at, e.g., 6 GHz) by replacing the gasket interface with a reed interface comprised of individual reeds typically made of copper. As with the gasket interface, however, the reeds break easily, and therefore need to be replaced frequently to maintain acceptable shielding.

One consequence of the necessity for completely sealing the RF chamber is that assembly line conveyors (typically comprising metallic components) cannot carry electronic devices into the cage for testing without disrupting the efficacy of the shielding. Maintenance and cost issues associated with maintaining effective RF shielding around current RF chamber doors, moreover, make more than one door into the chamber impractical—and thus make running a conveyor through (e.g., in one side and out another side of) the chamber impractical as well. Thus, although electronic devices are assembled on automated assembly lines, a device is typically removed from the automated assembly line for testing (e.g., RF), transported manually into an RF chamber, powered on, and then tested. After testing, the electronic device is powered down, manually removed from the RF chamber, and manually repositioned on the assembly line. The procedure becomes even more time-consuming and difficult if the electronic device being manufactured is large, heavy, and/or bulky (e.g., a desktop computer such as the iMac from Apple, Inc.) such that one worker can move only one device at one time. This cumbersome process slows production and increases the cost of manufacturing electronic devices. What is needed is a way to automate transport of an electronic device in a powered-on state from the automated assembly line into an RF isolated chamber for testing (e.g., RF) and out of the chamber and back to the automated assembly line after testing.

SUMMARY

In one embodiment is provided a method of automating transport of an electronic device in a powered-on state for testing during assembly line processing comprising: conveying on a first conveyor to a first staged table a pallet with an electronic device thereon, the first conveyor configured to provide power to the pallet being conveyed thereon and the pallet configured to maintain electrical continuity with the electronic device to thereby power the electronic device; transferring by the first conveyor the pallet with the electronic device thereon from the first conveyor to an upper stage of the first staged table while maintaining power to the pallet, thereby maintaining power to the electronic device; moving to a fixture in a chamber the upper stage of the first staged table having the pallet with the electronic device thereon; transferring by the upper stage of the first staged table the pallet with the electronic device thereon from the upper stage of the first staged table to the fixture in the chamber, the fixture configured to provide power to the pallet positioned thereupon, while maintaining power to the electronic device; withdrawing the upper stage of the first staged table from the chamber; and isolating the chamber from extraneous RF interference to perform testing on the electronic device.

In another embodiment is a method further comprising: moving to the fixture in the chamber an upper stage of a second staged table configured to provide power to electronic devices positioned thereupon; transferring by the upper stage of the second staged table the pallet with the electronic device thereon from the fixture to the upper stage of the second staged table while maintaining power to the pallet, thereby maintaining power to the electronic device; withdrawing from the chamber the upper stage of the second staged table whereupon the pallet with the electronic device thereon is positioned; transferring the pallet with the electronic device thereon from the upper stage of the second staged table to a second conveyor while maintaining power to the pallet, thereby maintaining power to the electronic device; and conveying the pallet with the electronic device thereon on the second conveyor to a designated location while maintaining power to the pallet, thereby maintaining power to the electronic device.

A system for automating transport of an electronic device in a powered-on state for testing during assembly line processing comprising: a pallet configured with: one or more electrical connector configured to electrically connect to the electronic device; electrical rails for making electronic contact to receive power; and an electrical connection configured to maintain electrical continuity between the one or more electrical connector and the electrical rails; a conveyor configured to convey the pallet and further configured with power pins for providing power to the pallet rails when the pallet is positioned thereupon; an RF isolatable chamber comprising two or more operable doors, the chamber configured to be RF isolated when each of the two or more operable doors are closed; a fixture within the chamber whereupon automated testing of the electronic device can be performed when the two or more operable doors of the chamber are closed, the fixture configured with power pins for providing power to the pallet rails when the pallet is positioned thereupon; and a staged table configured with power pins for providing power to the pallet rails when the pallet is positioned thereupon, the staged table further configured to be: within close proximity to the conveyor such that the pallet is transferrable from the conveyor to an upper stage of the staged table without interrupting power to the pallet; and extendable to the chamber fixture and configured for automatic placement of the pallet on the chamber fixture without interrupting power to the pallet.

DETAILED DESCRIPTION OF THE INVENTION

Embodiments of an RF isolatable chamber described herein offer benefits over current RF chambers, to wit: these embodiments have (1) a more robust door design than current RF chambers, which design reduces required maintenance and associated costs of that maintenance; and (2) one or more door, the presence of which allows testing of electronic devices to be incorporated as an automated flow-through process into assembly line manufacturing of electronic devices.

Further embodiments are described herein of a system and method to automate transport of an electronic device in a powered-on state for testing during assembly line processing. These embodiments provide a non-conveyor system to transport electronic devices under power into the RF isolatable chamber and thereby allow testing to be incorporated as an automated process into assembly line manufacturing of electronic devices. Thus, these embodiments allow testing (e.g., RF, functional/operational, sound, and/or light testing) on up to 100% of assembled electronic devices.

Figure 1:
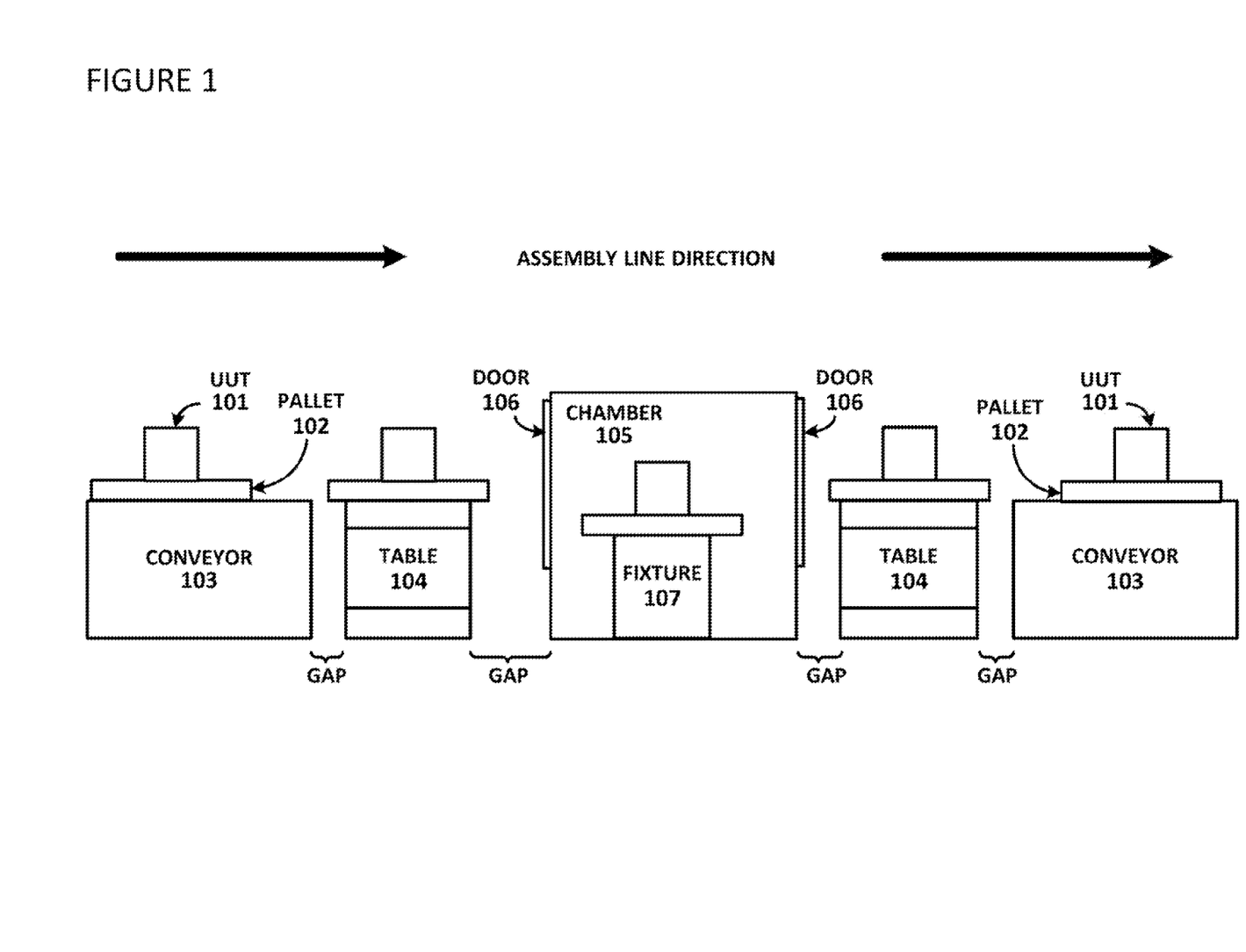
FIG. 1 is a block diagram illustrating a system and method of automating testing on an assembly line according to one embodiment.

As shown in the block diagram of FIG. 1 (not drawn to scale), a system to automate transport of electronic devices under power for testing (e.g., RF) during assembly line processing comprises: a unit under test (UUT) 101 affixed to a pallet 102, one or more conveyor 103, one or more multi-stage table 104, an RF isolatable chamber 105 having one or more chamber door assemblies 106, and a chamber fixture 107 within chamber 105. For assembly line processing, UUT 101 is placed on or affixed to pallet 102 (discussed further herein with reference to FIGS. 2 and 3). Pallet 102 (with UUT 101) is positioned on conveyor 10 (discussed further herein with reference to FIG. 4), conveyed to table 104 (discussed further herein with reference to FIGs. 5 and 6) and transferred thereto. Table 104 then moves pallet 102 (with UUT 101) through chamber door assembly 106 into chamber 105 (discussed further herein with reference to FIG. 9) and onto chamber fixture 107 (discussed further herein with reference to FIGS. 7 and 8) for testing of UUT 101. Conveyor 103, table 104, chamber 105, and chamber fixture 107 are each connected to a power source to receive electrical power that is in-phase among these structures.

UUT 101 is an electronic device subject to testing (e.g., RF) during manufacture. UUT 101 can be, e.g., a personal computer, a laptop, a mobile device such as a phone, a smartphone, a personal digital assistant (PDA), a media device e.g., the iPod or iPod Touch from Apple, Inc.), an electronic tablet (e.g., an iPad from Apple, Inc.), an electronic reader device (e.g., a Kindle from Amazon.com, Inc. of Seattle, Wash.), or any other product with wireless communication capabilities (e.g., WiFi or cellular communications) subject to testing during manufacture. UUT 101 is powered on before or after being affixed to or placed on pallet 102 and remains in a powered-on state throughout subsequent steps as discussed herein.

Figure 2:
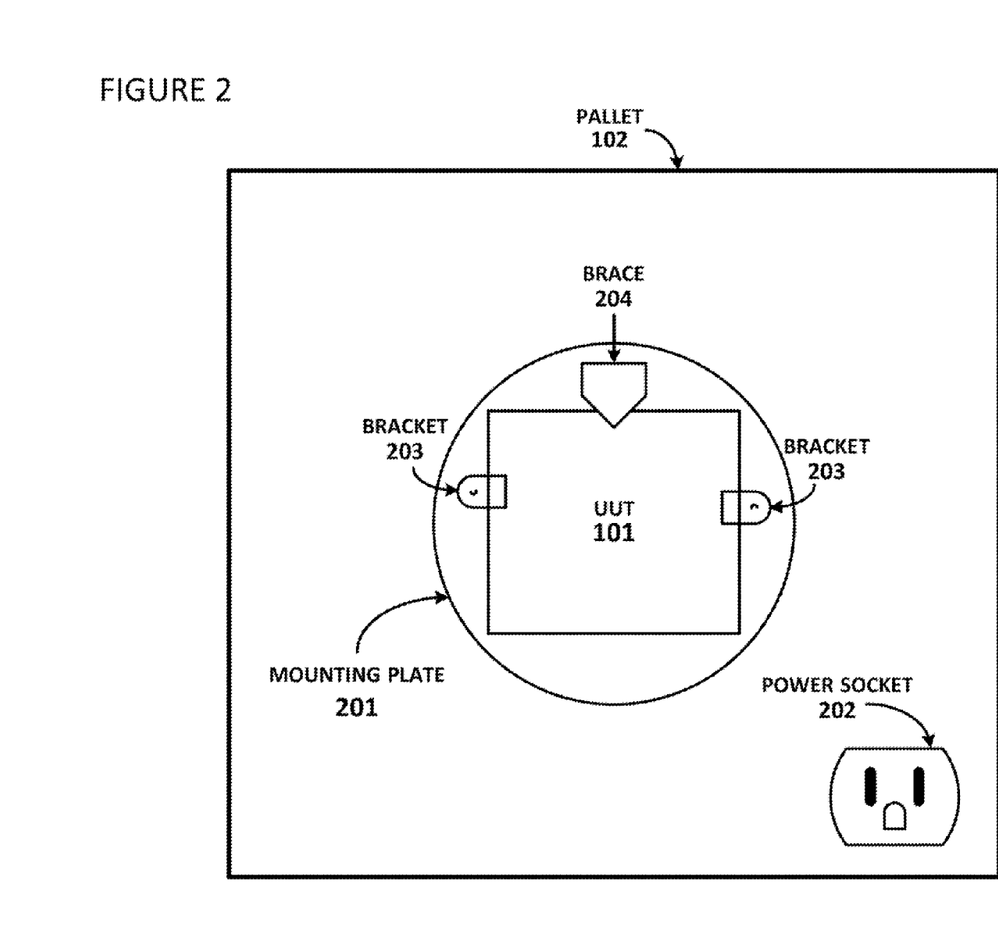
FIG. 2 is a schematic showing a topside view of a pallet according to one embodiment.

Pallet 102 is a platform to which UUT 101 is affixed or placed on for transport through the assembly line. Pallet 102 comprises a sturdy material such as a plastic, resin, or the like which can maintain structural integrity while traveling on the assembly line. Pallet 102 is shown in a topside-view schematic (FIG. 2) and in an underside-view schematic (FIG. 3) according to one embodiment. Referring first to FIG. 2, in one embodiment UUT 101 is affixed to a mounting plate 201 using one or more bracket 203. Mounting plate 201 is preferably a rotating plate (e.g., a lazy-Susan) that can rotate 360 degrees to allow easily adjustable positioning of UUT 101 for testing. In addition, one or more brace 204 can be used to secure UUT 101 at a specific angle to improve RF or other electronic signals. Once affixed, a power cable from UUT 101 is plugged into power socket 202. Power socket 202 is electrically connected to electrical rails on the underside of pallet 102 (as discussed further herein). In one embodiment, the power cable for UUT 101 can be a device-specific power cable that connects to a device-specific power socket 202.

Figure 3:
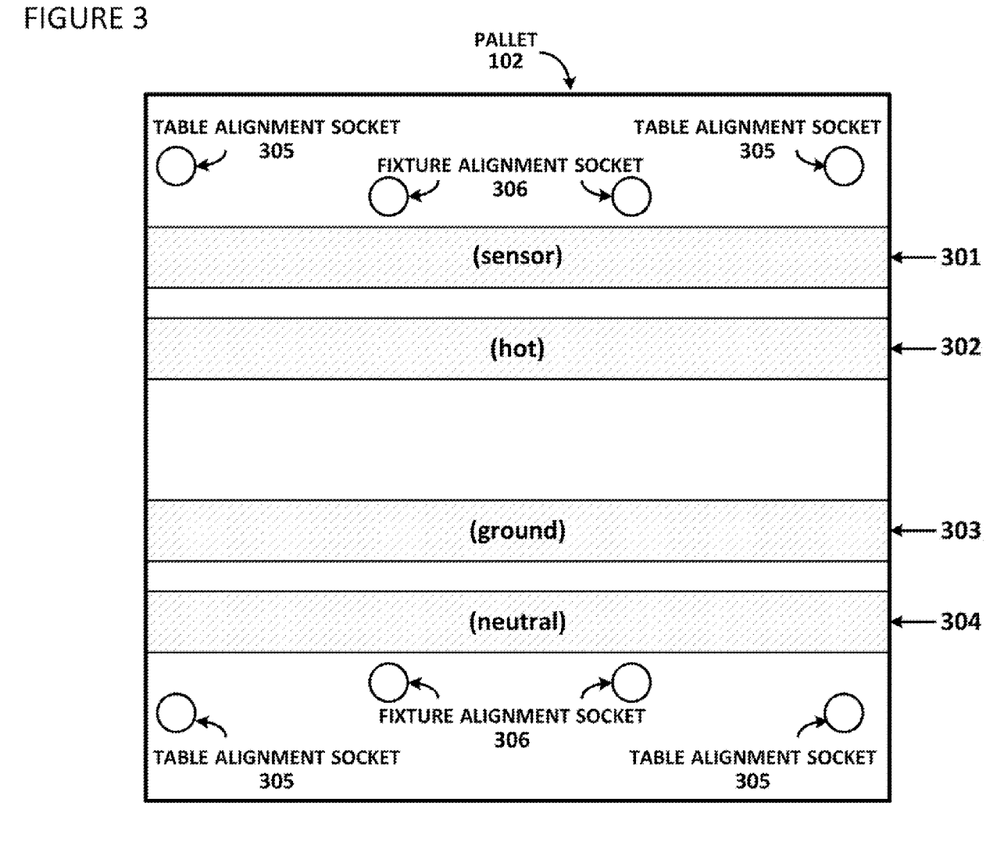
FIG. 3 is a schematic showing an underside view of the pallet according to one embodiment.

Referring now to FIG. 3, four metal rails traverse the underside of pallet 102: a sensor rail 301, a hot rail 302, a ground rail 303, and a neutral rail 304. The rails (301, 302, 303, and 304) are oriented on the underside of pallet 102 such that the pallet, when placed in a correct orientation on an assembly line structure, receives power when the rails are in contact with electrical pins of the assembly line structure (discussed further herein). Sensor rail 301, when powered through the pallet by the other rails, can be used to sense and track progress of pallet 102 along conveyor 103 and to trigger automated actions for transfer of pallet 102 to and from assembly line structures (e.g., from conveyor 103 to table 104 as discussed elsewhere herein) when sensor rail 301 contacts a power pin, thus completing an electric circuit.

The underside of pallet 102 contains several (e.g., four) table alignment sockets 305 and several (e.g., four) fixture alignment sockets 306 for the pallet with, respectively, table 104 and chamber fixture 107 (as discussed elsewhere herein). Alignment sockets 305 and 306 are preferably depressions in the underside of pallet 102 rather than holes through pallet 102.

Figure 4:
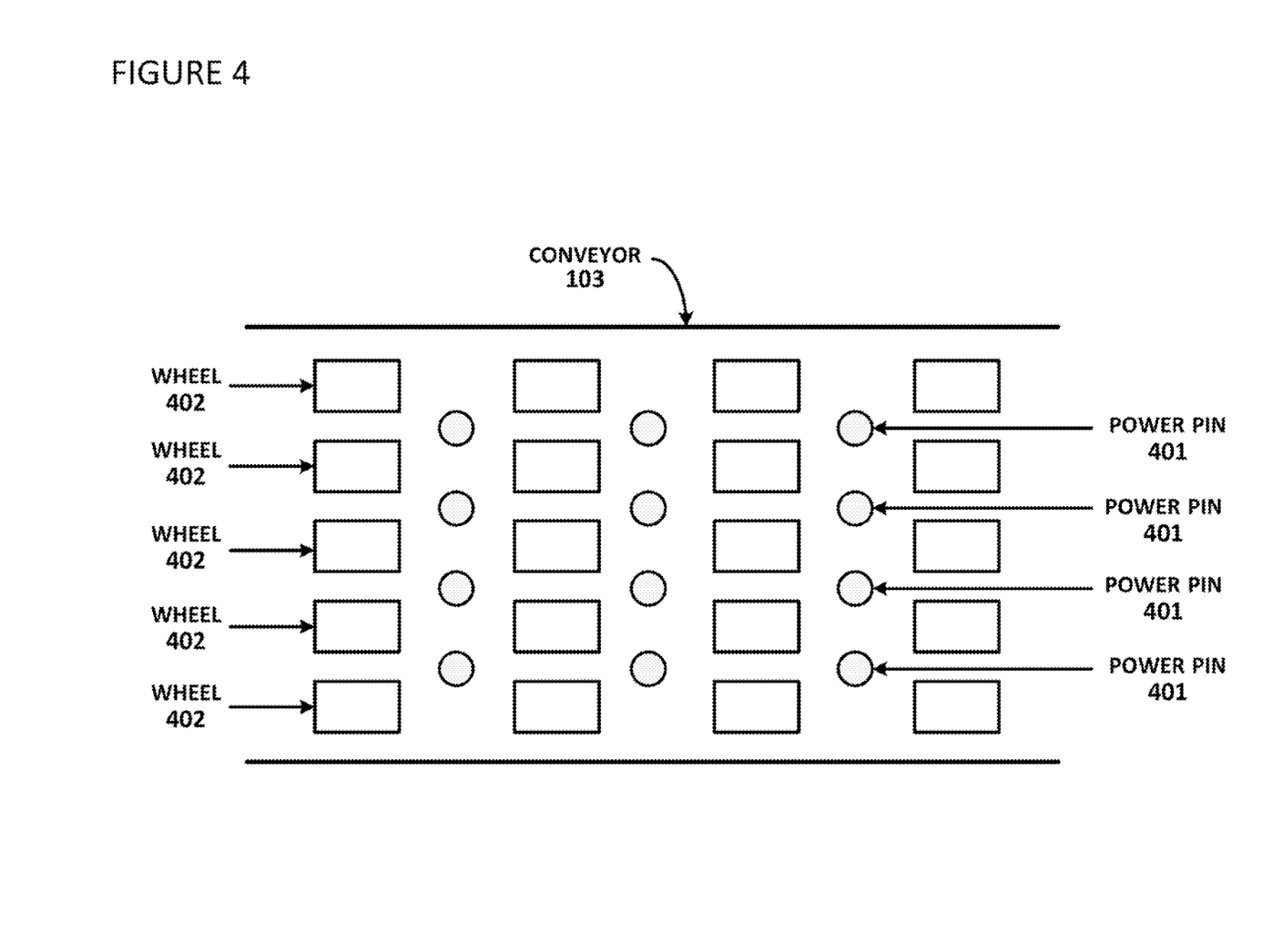
FIG. 4 is a schematic showing a topside view of a conveyor according to one embodiment.

Pallet 102 (with UUT 101) is positioned—either manually or automatically—on conveyor 103 to travel through the assembly line. Conveyor 103 is a conveyor system as is known in the electronics manufacturing industry. A topside view of conveyor 103 according to one embodiment is shown in FIG. 4. Conveyor wheels 402 rotate to move pallet 102 along conveyor 103. Interspersed among conveyor wheels 402 are lines of spring-loaded electrical power pins 401 (preferably pogo pins from Everett Charles Technologies, Pomona, Calif.) aligned perpendicular to a direction of travel of conveyor 103. Power pins 401 are connected to a power source (not shown) and oriented in the same fashion as rails 301, 302, 303, and 304 of pallet 102 such that when pallet 102 travels along conveyor 103, the rails of pallet 102 pass over and contact lines of power pins 401. As each line of power pins 401 is contacted, electrical continuity is established between each power pin 401 and the respective rail (301, 302, 303, or 304) with which it is in contact. Thus, electrical power passes from the power source, through power pins 401, and through rails 301, 302, 303, and 304 of pallet 102 to UUT 101, thereby maintaining continuous power to UUT 101 as it travels along conveyor 103. As pallet 102 travels along conveyor 103, successively contacted lines of power pins supply power to the rails of pallet 102.

Figure 5:
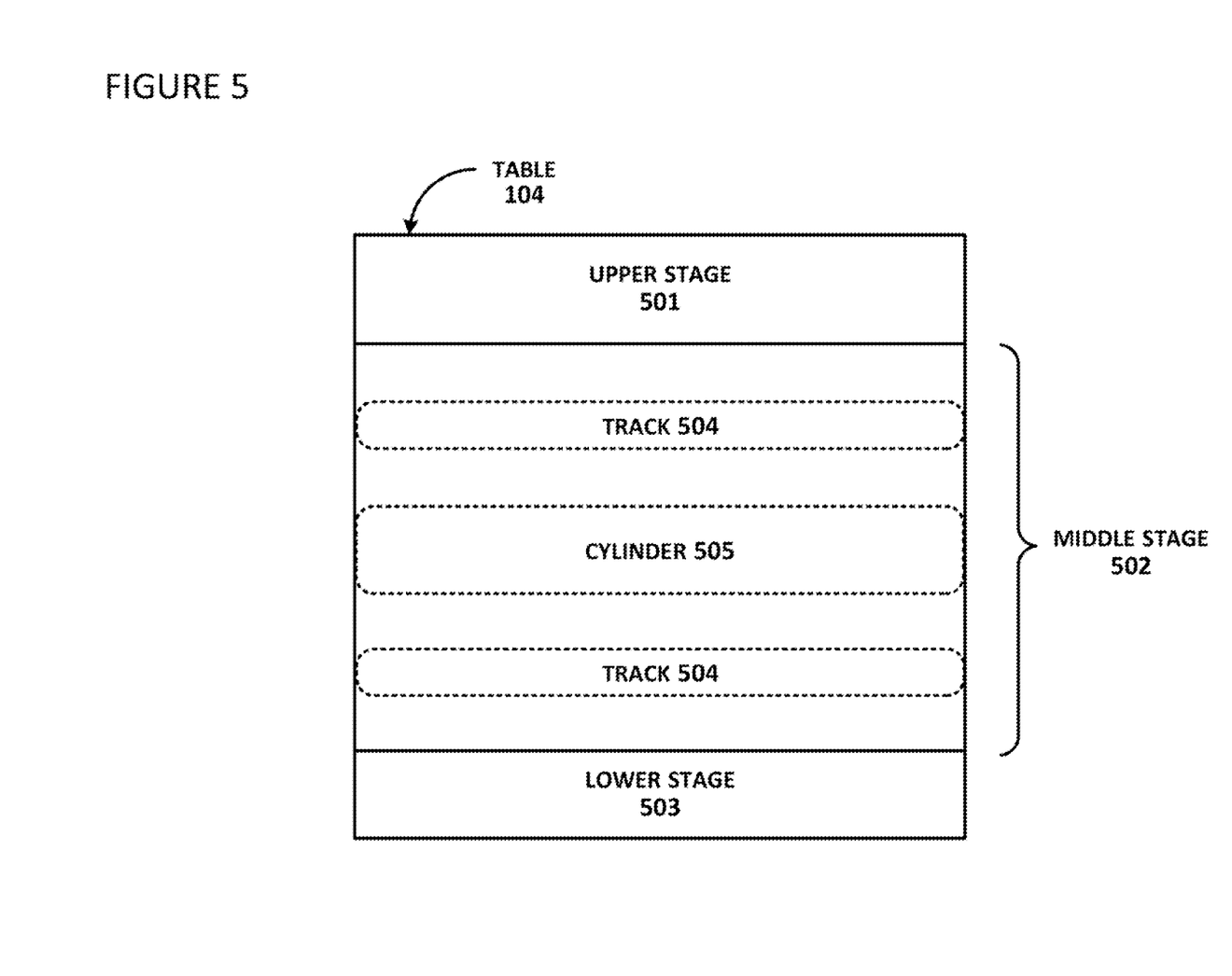
FIG. 5 is a schematic showing a side view of a table according to one embodiment.
Figure 6:
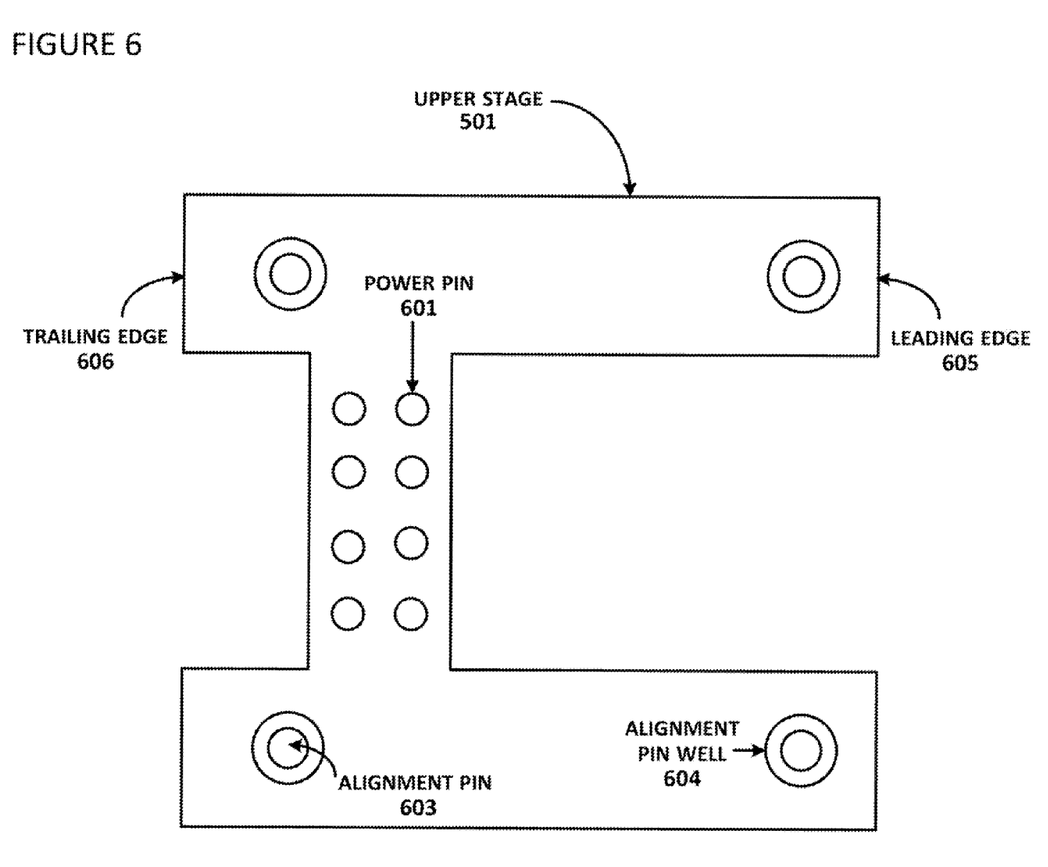
FIG. 6 is a schematic showing a topside view of an upper stage of the table according to one embodiment.

Conveyor 103 delivers pallet 102 (with UUT 101) to table 104. Referring now to FIG. 5, a schematic of table 104 is shown. Table 104 is a multi-stage table, preferably a cantilever, with an upper table stage 501, a middle table stage 502, and a lower table stage 503. Upper table stage 501 can be moved (e.g., extended horizontally), preferably using a slidable track system within middle table stage 502 while lower table stage 503 remains stationary. Table 104 is mated to conveyor 103 such that their top surfaces are at the same height, and both use the same electrical pin orientation to provide power to the underside of pallet 102. Upper table stage 501, as shown in a topside view in FIG. 6, is a fork-like structure with two arms connected by a bridge on which power pins 601 are positioned. Power pins 601 are arranged with the same electrical pin orientation as conveyor 103 so as to provide power to the rails on the underside of pallet 102. Near leading and trailing edges of each arm (605 and 606, respectively) are table alignment pins 603, each in an alignment pin well 604. Table alignment pins 603 can be beveled to increase pallet stability when pallet 102 is positioned thereon. Each table alignment pin 603 is vertically extendible and retractable through a cylinder-piston mechanism (not shown).

Referring again to FIG. 1, as pallet 102 (with UUT 101) approaches an end of conveyor 103 near table 104, a conveyor PLC (not shown) sends a signal to a table PLC (not shown) that pallet 102 is approaching. Table PLC prepares table 104 for pallet 102 (e.g., ensures that table 104 is in a non-extended state ready for pallet 102). Conveyor wheels 402 push pallet 102 off conveyor 103, across a gap between conveyor 103 and table 104, and onto trailing edge 606 of upper table stage 501. When a first sensor (not shown) on table 104 is activated (signaling that leading edge 605 of pallet 102 has broken an infrared beam (not shown) on an edge of table 104), then power is turned on to power pins 601 of table 104. As rails of pallet 102 contact a first row of table power pins 601, power is provided by table 104 to pallet 102. Table 104 is located within close proximity to conveyor 103 such that pallet 102 straddles the gap between conveyor 103 and table 104 while rails of pallet 102 make contact with conveyor power pins 401 as well as table power pins 601 (so both conveyor 103 and table 104 is provided power to pallet 102).

As conveyor wheels 401 continue to push pallet 102 off conveyor 103, pallet 102 continues to slide across upper table stage 501 until pallet 102 reaches leading edge 605 of upper table stage 501. When a sensor on table 104 (not shown) signals that pallet 102 is aligned over upper table stage 501, table alignment pins 603 are raised from alignment pin wells 604 into table alignment sockets 305 of pallet 102 to raise pallet 102 higher (e.g., an inch above the height of conveyor 103) and maintain pallet 102 in an aligned position above the surface of upper table stage 501. Because pallet 102 is greater in length and width than upper table stage 501, raising pallet 102 prevents conveyor 103 from continuing to push pallet 102 past a point at which pallet 102 is centered on upper table stage 501.

Once pallet 102 is maintained in the raised and aligned position, the slidable track system of middle stage 502 can be triggered. Middle stage 502 comprises one or more track 504 and a cylinder (e.g., hydraulic or pneumatic) 505. When triggered, cylinder 506 releases a piston (not shown) which applies force to push upper table stage 501 (with pallet 102 thereon) horizontally along tracks 504 away from conveyor 103, across a gap between table 104 and chamber 105, into chamber 105, and into a position surrounding (on three sides) chamber fixture 107.

Figure 7:
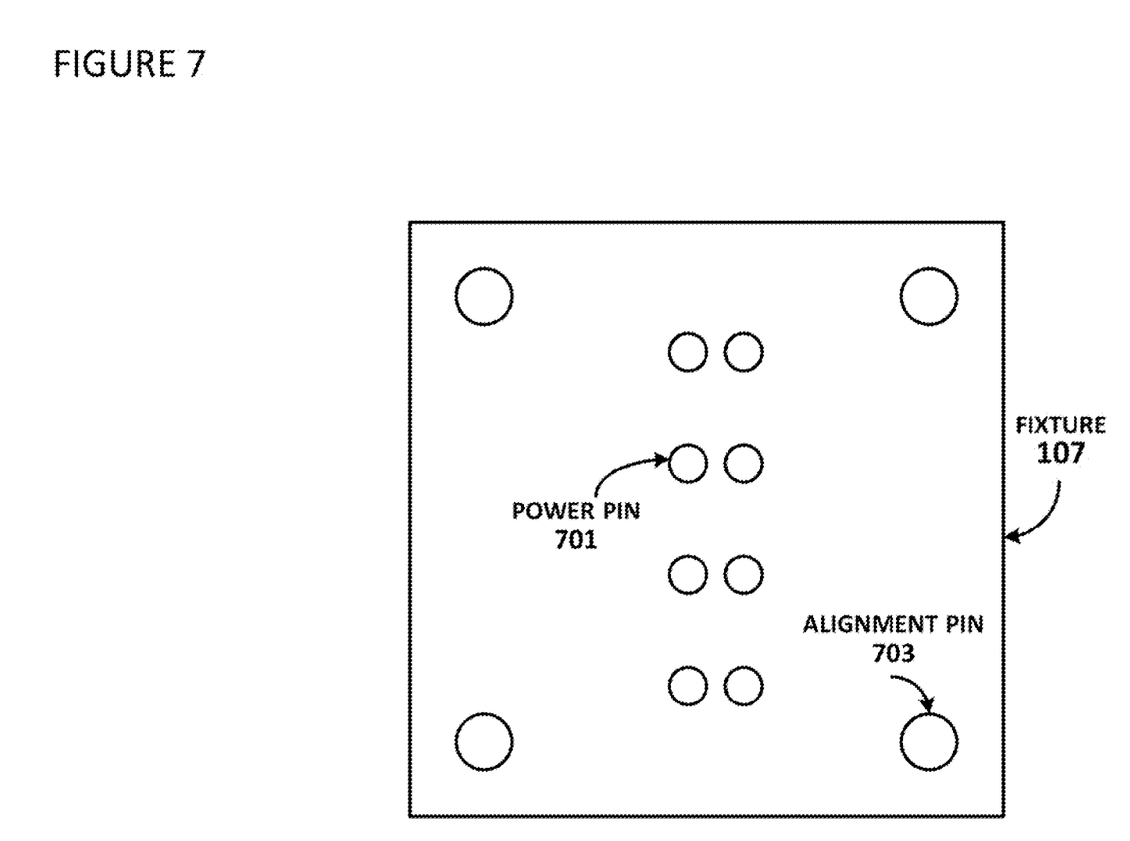
FIG. 7 is a schematic showing a topside view of a fixture in a chamber according to one embodiment.

A topside view of chamber fixture 107 is shown in FIG. 7. Chamber fixture 107 is a RF-invisible structure onto which pallet 102 is positioned for testing of UUT 101. Chamber fixture 107 is smaller in length and width than both upper table stage 501 and pallet 102. Arrayed on a top surface of chamber fixture 107 are power pins 701. Power pins 701 are arranged with the same electrical pin orientation as conveyor 103 and table 104 so as to contact the rails on the underside of pallet 102 when pallet 102 is aligned on chamber fixture 107. Also mounted on the top surface of chamber fixture 107 are four RF-invisible fixture alignment pins 703 which can be beveled to increase pallet stability when pallet 102 is positioned thereon. In one embodiment, fixture alignment pins 703 are larger than table alignment pins 603 so as to increase pallet stability. This embodiment is particularly useful when chamber fixture 107 is smaller than upper table stage 501.

Figure 8:
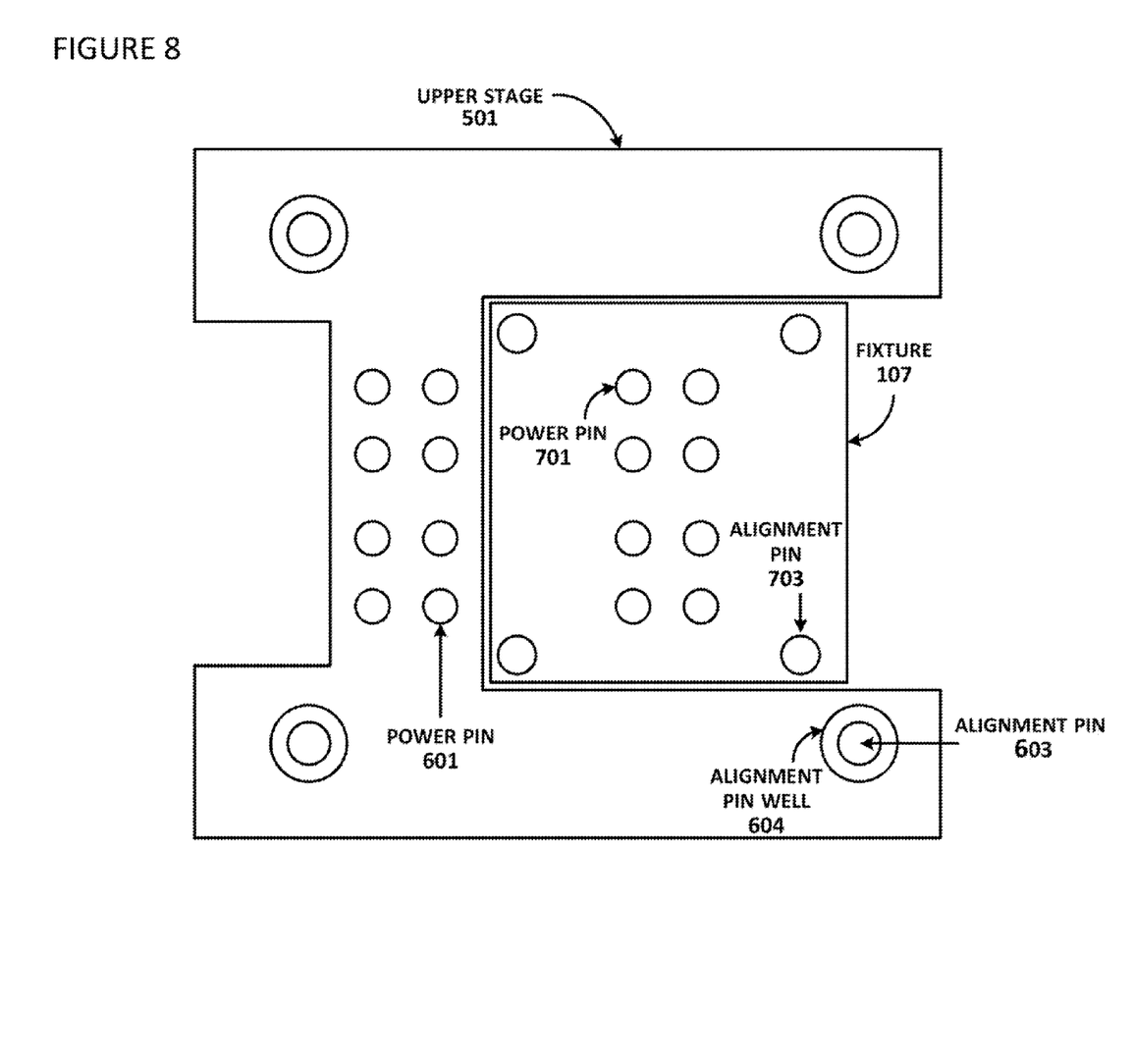
FIG. 8 is a schematic showing a topside view of the upper stage of the table positioned around the chamber fixture according to one embodiment.

FIG. 8 shows a topside view of upper table stage 501 and chamber fixture 107 during transfer of pallet 102 in one embodiment. Upper table stage 501 moves into chamber 105 to position pallet 102 (not shown in FIG. 8) such that the upper table stage 501 surrounds chamber fixture 107 on three sides. At this point, fixture alignment sockets 306 of pallet 102 (not shown in FIG. 8) are aligned over fixture alignment pins 703, table alignment pins 603 are seated in table alignment sockets 305 of pallet 102 (not shown in FIG. 8), and rails (301, 302, 303, and 304) of pallet 102 are in contact with upper table stage power pins 601. Once it has been determined that pallet 102 is aligned over chamber fixture 107 and that cylinder 505 is fully extended, table alignment pins 603 are lowered and thereby retracted from table alignment sockets 305 and into alignment pin wells 604. As table alignment pins 602 retract into alignment pin wells 604, upper table stage 501 descends until table alignment pins 603 are no longer in contact with pallet 102 (not shown in FIG. 8), fixture alignment pins 703 are seated in fixture alignment sockets 306 of pallet 102 (not shown in FIG. 8) and the rails of pallet 102 (not shown in FIG. 8) are in contact with fixture power pins 701. Upper table stage 501 is then withdrawn from chamber 105 and repositioned on middle stage 502 and lower table stage 503 of table 104.

In one embodiment, chamber 105 is an RF shielded enclosure (e.g., RF chamber) with at least two chamber doors so as to permit assembly line components to be automatically moved into and out of chamber 105 through chamber door assembly 106, preferably with ingress of assembly line components through one chamber door assembly 106 and egress of assembly line components through another chamber door assembly 106. Chamber 105 is formed from a conducting material (usually copper coated or zinc plated steel) which blocks external static and non-static electromagnetic fields from entering the chamber. When sealed by chamber door assembly 106 (preferably beryllium-coated copper (Be—Cu) reed interface), chamber 105 is an RF isolated chamber suitable for testing (e.g., RF) of electronic devices.

Figure 9A:
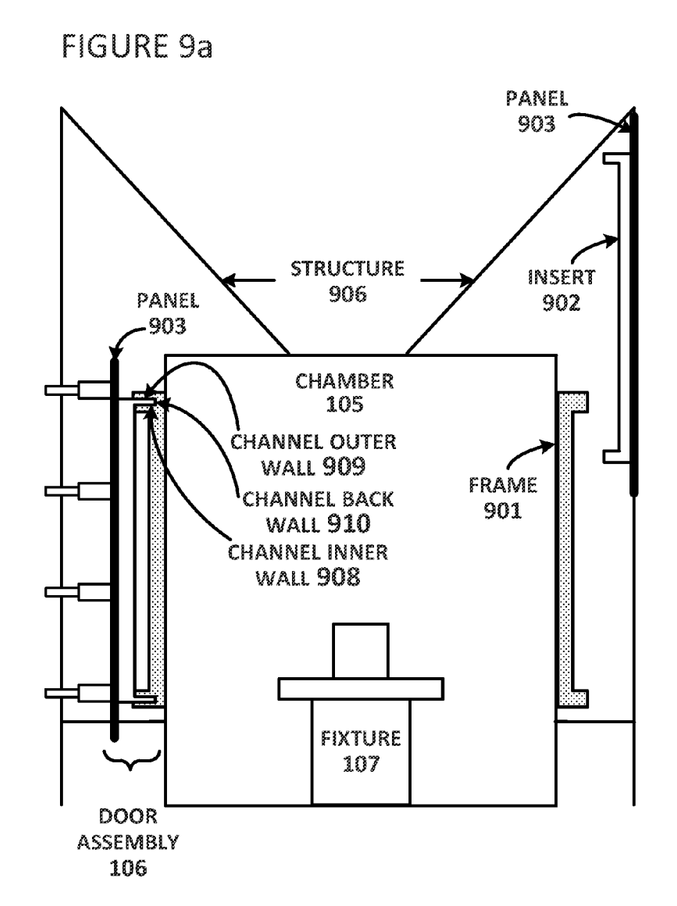
FIG. 9 is a schematic illustrating (a) a chamber with (b) a frame of a door assembly and (c) closure of the door to electrically isolate the chamber for testing according to one embodiment.
Figure 9B:
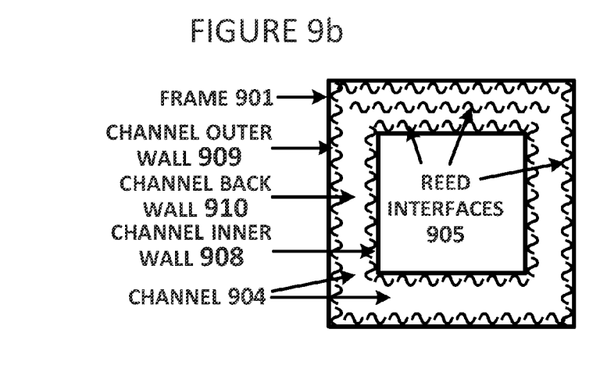
Figure 9C:
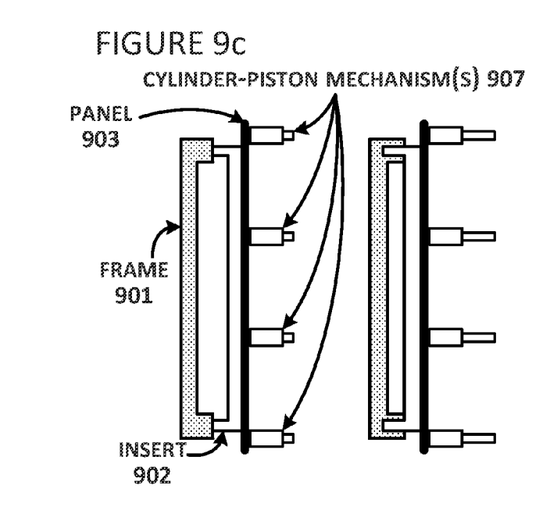

A structure and operation of chamber door assembly 106 according to one embodiment is detailed in FIGS. 9(a), (b), and (c). Referring first to FIG. 9(a), each chamber door assembly 106 comprises a frame 901, an insert 902, and a panel 903 attached to insert 902. In this figure, the right side of chamber 105 is open, as indicated by the separation of frame 901 from insert 902 and panel 903. As shown in a cross-section view in FIG. 9(a) and a full-face view in FIG. 9(b), frame 901 comprises an open-center, rectangular, metallic channel 904 preferably mounted (e.g., bolted) on a side of chamber 105 which allows entry into chamber 105 through the open center of rectangular channel 904. In another embodiment, channel 904 can be formed or cut into a side wall of chamber 105. Strips of Be—Cu reeds form a reed interface 905 along all four inner walls 908 and outer walls 909 of channel 904. In other embodiments, reed interface 905 can be placed also or instead on back walls 910 of channel 904. The Be—Cu reeds are convex-bent metal so each has spring-like flex. Corners of channel 904 can be coated with conductive paste to ensure that corners provide an uninterrupted electrical shield.

As shown in cross-section in FIGS. 9 (a) and (c), insert 902 is a rectangular steel plate with each side bent 90 degrees to form an edge along each of the four sides of insert 902, which edges can be slotted into channel 904 of frame 901. Insert 902 is attached to panel 903 which is attached to structure 906. Vertical movement of panel 903 (with insert 902 attached thereto) is controlled with a cylinder-piston mechanism (not shown). To close chamber door assembly 106, panel 903 (with insert 902 attached thereto) is dropped to the level of frame 901, and then pushed into frame 901 (as shown in the progression of FIG. 9 (c)) until reed interface 905 makes contact with, and holds the four bent edges of insert 902 with some tension in channel 904 of frame 901. Horizontal movement of panel 903 to push insert 902 into frame 901 is controlled by several (e.g., 8) small cylinder-piston mechanisms 907 arrayed around panel 903 so reed interface 905 contacts the four bent edges of insert 902 simultaneously. When insert 902 is fully inserted into frame 901 (as in FIGS. 9(a) and (c)), an unbent surface of insert 902 bridges the open center within frame 901, thereby closing chamber door assembly 106 and electrically isolating chamber 105 so testing (e.g., RF) of an electronic device can be performed therein.

In one embodiment, testing comprises RF testing. In other embodiments, testing comprises functional/operational, sound, and/or light testing.

After testing, chamber door assembly 106 is opened. To open chamber door assembly 106, panel 903 (with insert 902 attached thereto) is retracted from frame 901 and raised on structure 906. Once chamber door assembly 106 is open, pallet 102 can be removed from chamber 105 by reversing the process of bringing pallet 102 into chamber 105. Specifically, with reference again to FIG. 8, upper table stage 501 is moved into chamber 105 until upper table stage 501 surrounds chamber fixture 107 on three sides as shown in FIG. 8. At this point, table alignment pins 603 are positioned under table alignment sockets 305 of pallet 102, fixture alignment pins 703 are seated in fixture alignment sockets 306 of pallet 102, rails of pallet 102 are in contact with fixture power pins 701 and table power pins 601, and power is being provided to pallet 102 through upper table stage 501 of table 104 and/or through chamber fixture 107. Cylinders controlling table alignment pins 603 of upper table stage 501 are then operated such that table alignment pins 603 ascend through alignment pin wells 604 and thereby raise upper table stage 501 until table alignment pins 603 are seated in table alignment sockets 305 on pallet 102 (not shown in FIG. 8). Table alignment pins 602 continue to ascend, thereby raising upper table stage 501 further and lifting pallet 102 off fixture alignment pins 703. Once pallet 102 has been lifted off fixture alignment pins 703, upper table stage 501 (with pallet 102 positioned thereon) is withdrawn from chamber 105 through chamber door assembly 106.

When table stage 501 (with pallet 102) has been withdrawn to a point where table stage 501 is centered over table lower stage 503, pallet 102 (greater in length and width than upper table 501) extends over table 104, over the gap between table 104 and conveyor 103, and over a portion of conveyor 103, Table alignment pins 603 are then retracted into table alignment pin wells 602. When table alignment pins 603 have been retracted, pallet 102 (with UUT 101) is in contact with both power pins 601 on upper table stage 501 and power pins 401 of conveyor 103, Wheels 402 of conveyor 103 then move pallet 102 (with UUT 101) along conveyor 103.

The two or more chamber door assemblies 106 of chamber 105 can open and close simultaneously or sequentially. In one embodiment, the two or more chamber door assemblies 106 open simultaneously, thereby allowing a second UUT 101 on a second pallet 102 to be moved into chamber 105 as a first UUT 101 on a first pallet 102 is being withdrawn from chamber 105. In this embodiment, a first upper table stage 501 that is to withdraw the first UUT 101 enters chamber 105 before a second upper table stage 501 that is delivering the second UUT 101 so the first pallet 102 (with UUT 101) can be withdrawn from chamber fixture 107 before second upper table stage 501 attempts to position second pallet 102 on chamber fixture 107. In another embodiment, chamber 105 can have only one chamber door assembly 106 through which a first UUT 101 (on a first pallet 102) is withdrawn from chamber 105 through a first chamber door assembly 106, after which a second UUT 101 (on a second pallet 102) is moved into chamber 105 through the first chamber door assembly 106.

It is to be understood that various PLCs as described herein can be located within individual assembly line components and/or can be located within a separate housing, and that multiple PLCs can be combined as one PLC with programming logic for multiple assembly line components (e.g., conveyor 103, table 104, and chamber fixture 107). One of skill in the art will further recognize that other sensors can be used to detect the presence of pallet 102 on assembly line components (e.g., optical sensors. such as infrared sensors, or otherwise).

Chamber 105 offers several benefits over traditional RF test boxes. Because the edges of insert 902 are inserted in a knife-like fashion into channeled reed-interface 905 of frame 901, the reeds are not subject to being compressed between the full weight of a heavy door and a wall of the channel. Thus, the lifetime of the reeds used with chamber 105 is greatly extended compared to the lifetime of reeds which are frequently crushed from being compressed between a weighty hinged door and a face of a frame on which the reed interface is mounted as in a typical RF chamber, thereby reducing maintenance costs (in terms of chamber down time and money). Furthermore, because reed interface 905 lines each side of channel 904 of frame 901, shielding can be maintained even if one (or more) reed breaks, because reeds on an opposing side of channel 904 can maintain metallic continuity necessary for shielding. An additional benefit of chamber 105 is that 100 dB shielding at 6 GHz can be consistently achieved, making testing of the electronic devices more reliable. Furthermore, because that level of shielding can be attained even with the two or more doors, chamber 105 can be used with an extendable table as described herein to automate transport of electronic devices for testing as part of an assembly line process. This can allow up to 100% testing RF) of assembled units.

Figure 10:
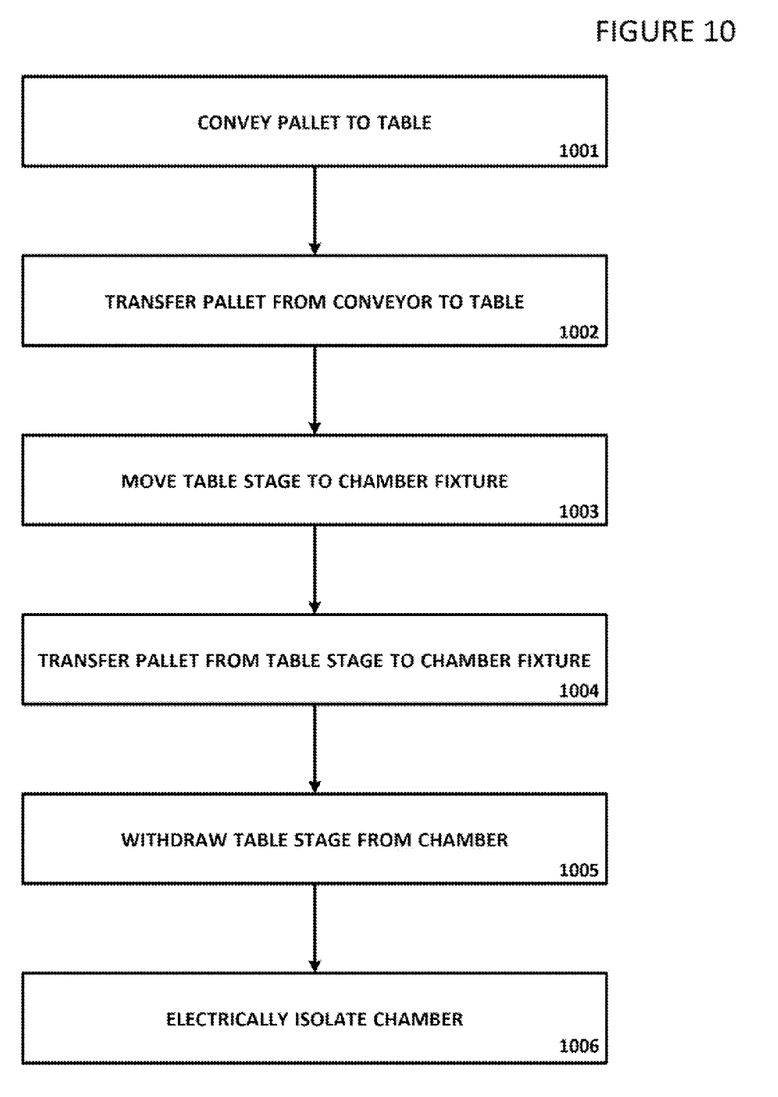
FIG. 10 is a flowchart detailing a method of automating transport of an electronic device in a powered-on state for testing during assembly line processing according to one embodiment.

A flowchart detailing a method to automate transport of an electronic device in a powered-on state for testing (e.g., RF) during assembly line processing according to one embodiment is presented in FIG. 10.

In step 1001, pallet 102 (with UUT 101 in a powered-on state) is conveyed by conveyor 103 to table 104 as described herein.

In step 1002, pallet 102 (with UUT 101) is transferred to table 104 as described herein.

In step 1003, upper table stage 501 of table 104 is moved through chamber door assembly 106 to chamber fixture 107 as described herein.

In step 1004, pallet 102 (with UUT 101) is transferred from upper table stage 501 to chamber fixture 107 as described herein.

In step 1005, upper table stage 501 is withdrawn from chamber 105 through chamber door assembly 106 as described herein.

In step 1006, chamber 105 is RF isolated by closing chamber doors 106 as described herein.

Following step 1006, testing (e.g., RF) can be conducted through automated control on UUT 101 (powered by chamber fixture 107 through pallet 102). In one embodiment, connectors affixing UUT 101 to pallet 102, in addition to providing power, can also provide signal lines that can be used to trigger operational testing of UUT 101.

Once testing is completed, pallet 102 (with UUT 101) can be removed from chamber 105 and delivered to a desired location. A flowchart detailing a method to automate transport of an electronic device in a powered-on state after testing for further assembly line processing according to one embodiment is presented in FIG. 11.

Figure 11:
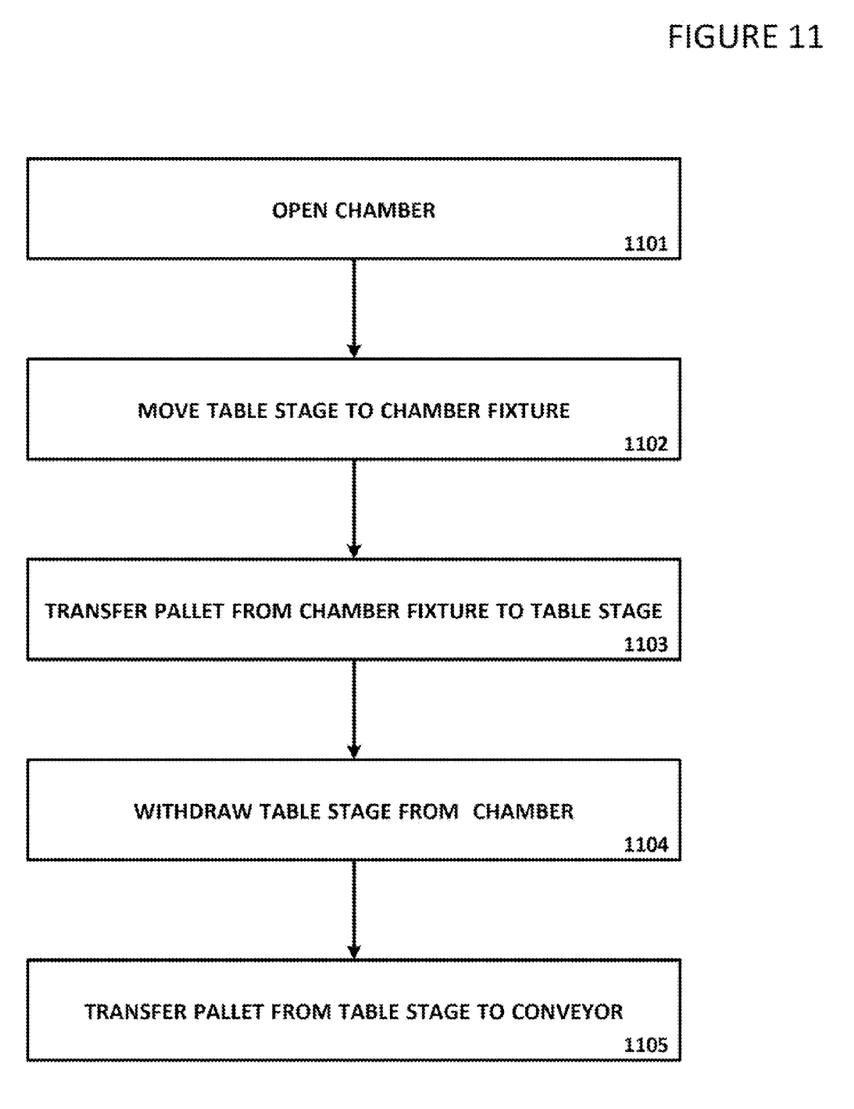
FIG. 11 is a flowchart detailing a method of automating transport of an electronic device in a powered-on state for assembly line processing after testing according to one embodiment.

In step 1101, chamber door assemblies 106 are opened as described herein.

In step 1102, upper table stage 501 of table 104 is moved into chamber 105 through chamber door assembly 106 to chamber fixture 107 as described herein.

In step 1103, pallet 102 (with UUT 101) is transferred from chamber fixture 107 to upper table stage 501 as described herein.

In step 1104, upper table stage 501 (with pallet 102 aligned thereon) is withdrawn from chamber 105 through chamber door assembly 106 as described herein.

In step 1105, pallet 102 (with UUT 101) is transferred from upper table stage 501 to conveyor 103.

Once pallet 102 (with UUT 101) is transferred to conveyor 103, pallet 102 can be conveyed to any desired location for further assembly line processing.

The method detailed in FIGS. 10 and 11 are preferably performed simultaneously for different UUTs 101. In this embodiment, as a first UUT 101 (on a first pallet 102) is withdrawn from chamber 105 through a first chamber door assembly 106 as a second UUT 101 (on a second pallet 102) is moved into chamber 105 through a second chamber door assembly 106. One of skill in the art will recognize, however, that embodiments of the method described herein can be performed sequentially such that a first UUT 101 (on a first pallet 102) is withdrawn from chamber 105 through a first chamber door assembly 106, after which a second UUT 101 (on a second pallet 102) is moved into chamber 105 through the first chamber door assembly 106.

The disclosed method and apparatus has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than those described above. For example, different types of alignment pins between the pallets and the fixture, perhaps more complex than those described herein, may be used, as well as possibly between other system components. As another example, the RF isolated chamber discussed herein can also be an RF anechoic chamber such as have been used to test antennas and radars. One of skill in the art will recognize that such a chamber will be covered internally with radiation absorbent material to reduce reflection and external noise in radio frequencies.

Further, it should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc., or a computer network wherein the program instructions are sent over optical or electronic communication links. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s)

disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. An RF isolatable chamber comprising:
   a chamber enclosure comprising a conducting material and having an opening on a side wall;
   a channel encircling the chamber opening, the channel having an inner wall and an outer wall;
   an inner reed interface attached to the inner wall of the channel;
   an outer reed interface attached to the outer wall of the channel; and
   a metallic insert having bent edges surrounding an unbent surface, the bent edges configured to fit within the channel;
   wherein the chamber is configured to be sealed to isolate the chamber from RF interference by moving the metallic insert towards the channel enclosure thereby slotting the bent edges of the metallic insert into the channel such that the bent edges of the metallic insert are in contact with the inner reed interface and the outer reed interface of the channel and the unbent surface of the metallic insert bridges the chamber opening.

2. The chamber of claim 1 wherein the inner reed interface and the outer reed interface comprise metallic reeds having a spring-like flex.

3. The chamber of claim 1 wherein the inner reed interface and the outer reed interface each comprise strips of beryllium-coated copper reeds.

4. The chamber of claim 1 further comprising a back reed interface attached to a back wall of the channel.

5. The chamber of claim 4 wherein the bent edges of the metallic insert are in contact with the back reed interface when the chamber is sealed.

6. The chamber of claim 1 wherein the channel is formed or cut into the side wall of the chamber enclosure.

7. The chamber of claim 1 wherein the channel further comprises a frame mounted on the side wall of the chamber enclosure.

8. The RF isolatable chamber of claim 1 is further configured to be an RF anechoic chamber.

9. The chamber of claim 1 further comprising a fixture whereupon automated testing of an electronic device is performed when the chamber is sealed, the fixture configured to provide power to an electronic device connected thereto.

10. The chamber of claim 1 wherein the chamber is further configured for an electronic device to be automatically conveyed into the chamber for electronic testing and for the electronic device to be automatically conveyed out of the chamber after electronic testing.

11. An RF isolatable chamber comprising:
    a chamber enclosure comprising a conducting material and having a first opening in a first side wall of the chamber enclosure and a second opening in a second side wall of the chamber enclosure;
    a first channel encircling the first opening, the first channel having a first inner wall and a first outer wall;
    a second channel encircling the second opening, the second channel having a second inner wall and a second outer wall;
    a first inner reed interface attached to the first inner wall;
    a second inner reed interface attached to the second inner wall;
    a first outer reed interface attached to the first outer wall;
    a second outer reed interface attached to the second outer wall;
    a first metallic insert having first bent edges surrounding a first unbent surface, the first bent edges configured to fit within the first channel; and
    a second metallic insert having second bent edges surrounding a second unbent surface, the second bent edges configured to fit within the second channel;
    wherein the chamber is configured to be sealed to isolate the chamber from RF interference by moving the first metallic insert and the second metallic insert towards the chamber enclosure thereby:
       slotting the first bent edges of the first metallic insert into the first channel such that the first bent edges of the first metallic insert are in contact with the first inner reed interface and the first outer reed interface and the first unbent surface of the first metallic insert bridges the first opening encircled by the first channel; and
       slotting the second bent edges of the second metallic insert into the second channel such that the second bent edges of the second metallic insert are in contact with the second inner reed interface and the second outer reed interface and the second unbent surface of the second metallic insert bridges the second opening encircled by the second channel.

12. The chamber of claim 11 wherein the first inner reed interface, the first outer reed interface, the second inner reed interface, and the second outer reed interface comprise metallic reeds having a spring-like flex.

13. The chamber of claim 11 wherein the first inner reed interface, the first outer reed interface, the second inner reed interface, and the second outer reed interface comprise beryllium-coated copper reeds.

14. The chamber of claim 11 further comprising a first back reed interface attached to a back wall of the first channel and a second back reed interface attached to a back wall of the second channel.

15. The chamber of claim 14 wherein the first bent edges of the first metallic insert are in contact with the first back reed interface of the first channel and the second bent edges of the second metallic insert are in contact with the second back reed interface of the second channel when the chamber is sealed.

16. The chamber of claim 11 wherein the first channel is formed or cut into the first side wall of the chamber enclosure and the second channel is formed or cut into the second side wall of the chamber enclosure.

17. The chamber of claim 11 wherein the first channel comprises a first frame mounted on the first side wall of the chamber enclosure and the second channel comprises a second frame mounted on the second side wall of the chamber enclosure.

18. The RF isolatable chamber of claim 11 is further configured to be an RF anechoic chamber.

19. The chamber of claim 11 further comprising a fixture whereupon automated testing of an electronic device is performed when the chamber is sealed, the fixture configured to provide power to an electronic device connected thereto.

20. The chamber of claim 11 wherein the chamber is further configured for an electronic device to be automatically conveyed into the chamber for electronic testing and for the electronic device to be automatically conveyed out of the chamber after electronic testing.

* * * * *